(12) United States Patent
Greenberg et al.

(10) Patent No.: US 8,455,924 B2
(45) Date of Patent: *Jun. 4, 2013

(54) MULTI-LEVEL INTERCONNECTIONS FOR AN INTEGRATED CIRCUIT CHIP

(75) Inventors: David Ross Greenberg, White Plains, NY (US); John Joseph Pekarik, Underhill, VT (US); Jorg Scholvin, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 655 days.

This patent is subject to a terminal disclaimer.

(21) Appl. No.: 12/139,716

(22) Filed: Jun. 16, 2008

(65) Prior Publication Data

US 2008/0237648 A1 Oct. 2, 2008

Related U.S. Application Data (63) Continuation of application No. 11/160,463, filed on Jun. 24, 2005, now Pat. No. 7,414,275.

(51) Int. Cl.
*H01L 27/105* (2006.01)

(52) U.S. Cl.
USPC ........... 257/211; 257/203; 257/207; 257/208; 257/E27.081

(58) Field of Classification Search
USPC ................ 257/211, 203, 210, E27.081, 207, 257/208, 752, 758
See application file for complete search history.

(56) References Cited

U.S. PATENT DOCUMENTS

| | | | |
|---|---|---|---|
| 5,111,276 A | 5/1992 | Hingarh et al. | |
| 5,327,012 A | 7/1994 | Yano et al. | |
| 5,416,431 A | 5/1995 | Straussi | |
| 5,528,061 A | 6/1996 | Iwasaki | |
| 5,619,048 A | 4/1997 | Yokota | |
| 5,672,894 A | 9/1997 | Maeda et al. | |
| 5,712,510 A | 1/1998 | Bui et al. | |
| 5,760,476 A | 6/1998 | Varker et al. | |
| 5,760,477 A | 6/1998 | Cronin | |
| 5,930,667 A | 7/1999 | Oda | |
| 6,483,045 B1 | 11/2002 | Wang et al. | |
| 6,667,552 B1 | 12/2003 | Buynoski | |
| 6,833,331 B2 * | 12/2004 | Saito et al. | 438/789 |
| 6,838,772 B2 | 1/2005 | Saitoh et al. | |
| 7,023,090 B2 * | 4/2006 | Huang et al. | 257/756 |
| 7,414,275 B2 * | 8/2008 | Greenberg et al. | 257/211 |
| 2001/0015464 A1 | 8/2001 | Tamaki | |
| 2002/0000668 A1 | 1/2002 | Sakihama | |
| 2002/0063333 A1 | 5/2002 | Farrar | |

(Continued)

FOREIGN PATENT DOCUMENTS

| | | |
|---|---|---|
| DE | 19613409 A1 | 10/1997 |
| JP | 8181308 A | 7/1996 |
| JP | 2003529936 A | 10/2003 |
| WO | 2005024912 A2 | 3/2005 |

*Primary Examiner* — Thinh T Nguyen
(74) *Attorney, Agent, or Firm* — Michael LeStrange; Roberts Mlotkowski Safran & Cole, P.C.

(57) ABSTRACT

Multilevel metallization layouts for an integrated circuit chip including transistors having first, second and third elements to which metallization layouts connect. The layouts minimize current limiting mechanism including electromigration by positioning the connection for the second contact vertically from the chip, overlapping the planes and fingers of the metallization layouts to the first and second elements and forming a pyramid or staircase of multilevel metallization layers to smooth diagonal current flow.

11 Claims, 6 Drawing Sheets

U.S. PATENT DOCUMENTS

| | | |
|---|---|---|
| 2002/0100984 A1 | 8/2002 | Oshima et al. |
| 2002/0113271 A1* | 8/2002 | Noguchi et al. ............ 257/369 |
| 2003/0064574 A1 | 4/2003 | Parker et al. |
| 2003/0077896 A1 | 4/2003 | Saito et al. |
| 2004/0070078 A1 | 4/2004 | Ho et al. |
| 2004/0145045 A1 | 7/2004 | Huang et al. |
| 2004/0238965 A1 | 12/2004 | Iwasaki et al. |
| 2005/0161706 A1 | 7/2005 | Sutardja |
| 2006/0071241 A1 | 4/2006 | Jin |

* cited by examiner

MULTI-LEVEL INTERCONNECTIONS FOR AN INTEGRATED CIRCUIT CHIP

CROSS-REFERENCE TO RELATED APPLICATION

This application is a continuation of application Ser. No. 11/160,463, filed Jun. 24, 2005.

FIELD OF THE INVENTION

The present invention relates to multilevel interconnection structures for integrated circuits and, more particularly, to multilevel interconnection structures which will minimize electromigration or current limiting mechanisms that result from smaller cross-section metallization and higher current.

BACKGROUND OF THE INVENTION

The fabrication of integrated circuits devices is well known. They are manufactured by fabricating a plurality of active devices, such as field effect transistors (FET) with sources, drains and gates, and passive devices on and in a semiconductor wafer substrate, such as silicon. The transistors, which also can be bipolar with emitters, collectors and bases, and the passive devices are connected by a conductive material, such as metal in the form of conductive patterns. Metal, such as aluminum or copper, is used for the first and higher conductive layers or what is called BEOL (Back End of the Line). Doped polysilicon is normally used at the gate of the FET.

When electrical current flows through the metal conductive patterns or interconnections, electromigration or current limiting mechanisms due to heat may occur. These mechanisms grow increasingly severe as the cross-section of the conductive pattern is decreased along with an increase in the current. The result can be failure of one or more integrated circuits. Electromigration is due to metal atoms being pushed by the electron flow comprising the current, in proportion to the current density, and may cause a disconnection of the interconnection or an "open". For a given current being carried by an interconnection, current density becomes larger, and thus electromigration more severe, as the cross-section of the interconnect becomes smaller with technology scaling. Electromigration is becoming an increasing problem in the BEOL of largely scaled integrated circuit chips with transistors such as FETs, such as CMOS devices, and bipolars devices. In multi-finger applications in which the layout of the devices is such that the metalization is in parallel stripes or fingers, these fingers carry significant current densities and current limiting mechanisms including electromigration are a major concern. Such devices include: power amplifiers, RF switches, I/O drivers, small analog devices operating near peak ft, devices with moderate current densities but operating at high ambient temperature (above 80° C.) or chips that develop a large amount of heat during operation, and any device with long fingers or conductive stripes corresponding to the width of, for example, a channel in a FET.

Figure 1:
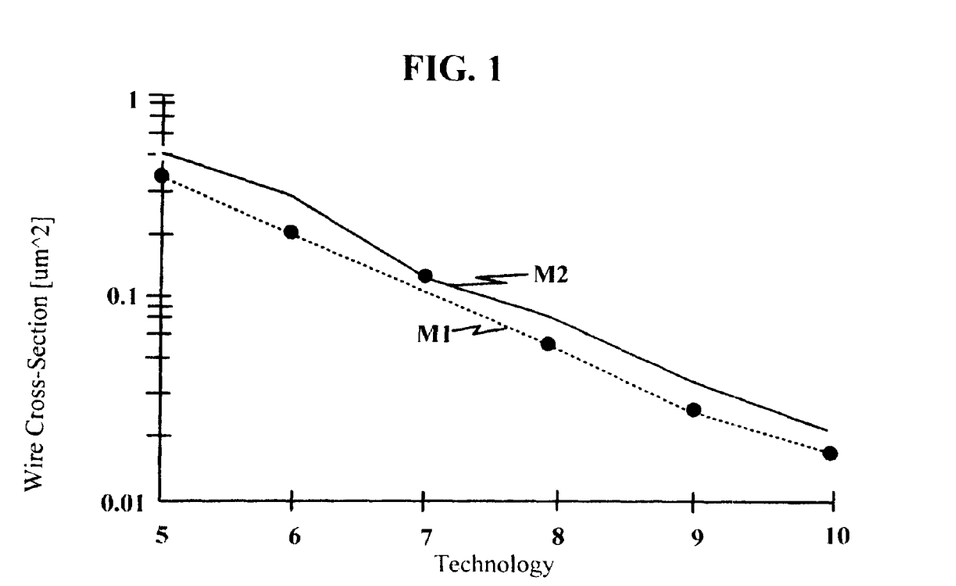
FIG. 1 is a log-scale graph plotting (M1) and (M2) wire cross-sections in square microns (um$^2$) versus generation of device technology.
Figure 2:
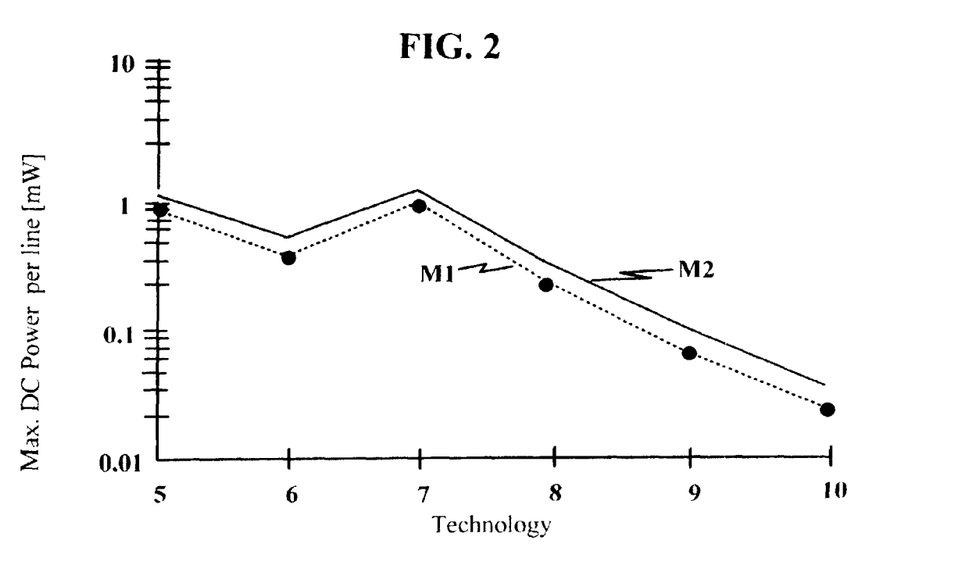
FIG. 2 is a log-scale graph plotting the maximum DC power per metal (M1) and (M2) wire in milliwatts (mW) versus generation of device technology.

FIG. 1 shows a graph plotting exponentially the reduction of the wire cross-section with each improved technology generation in which minimum feature size is decreased. The lower plot is for (M1) (first level metal) and the higher plot is for (M2) (second level metal). As shown by the graph, the reduction of the cross-section of the wire is substantial from technology 5 to technology 10. In turn, the current capability of the wire is substantially lowered with the scaling in technology. However, current does not scale in step with the scaling in technology in the above list of applications. For example, a wireless power amplifier (PA) requiring 100 mW of output power for a particular application will be required to achieve this power regardless of the technology. When a constant power is required, the required current actually increases with downward device scaling and improvements in technology because the supply voltage (V supply) is scaled down. FIG. 2 shows this trend of DC power being routed though a minimum width wire with downward device scaling and improvement in technology. (At Technology 7 and beyond, the effect of switching the interconnect metal from aluminum to the more electromigration-resistant metal copper is shown in both FIGS. 1 and 2.) Accordingly, device scaling and technology improvements are amplifying the problem of current limiting mechanisms including electromigration for multi-finger application that carry significant current densities. This device scaling causes an increase in length of the parallel metallization stripes or fingers and a corresponding increase in current density at the end of the fingers.

Table I below is a comparison of different prior art layouts using a common technology, herein Technology 9, and without changing the gate pitch. The (M2), (M3) and (M4) in Table I are identifying the levels of metal from the wafer. The second level metal is (M2) whereas (M3) is the third level metal, and (M4) is the fourth level metal.

TABLE I

| LAYOUT | METAL LEVELS | MAX UNIT FINGER WIDTH | IMPROVEMENT |
| --- | --- | --- | --- |
| RF PCell* | 2 | 0.76 | 1.00 |
| RF PCell, Wide Metals | 2 | 1.33 | 1.75 |
| Strap** M2 with M3 | 3 | 1.40 | 1.84 |
| Strap M2 with M3, wide metals | 3 | 2.52 | 3.32 |
| Strap M2 with M3 and M4 | 4 | 1.68 | 2.21 |
| Strap M2 with M3 and M4, wide metals | 4 | 3.36 | 4.42 |
| Half-Plane*** PCell | 2 | 0.88 | 1.16 |
| Half-Plane PCell, wide metals | 2 | 1.93 | 2.54 |

*PCell is a reference layout for a high-frequency CMOS FET.
**Strapping is wiring the same current path using two or more consecutive levels of metal tied together by vias in order to increase the total cross section and carry more current.
***Half-Plane is a layout where both the source and drain are each wired to a separate plane of M2 that spans the device over half the M finger width.

The above Table I illustrates that, by strapping (M2) with (M3) and (M4), 3.36 um is the widest metal dimension achievable. Compared to the standard RF PCell at 0.76 um metal width and the improvement base of 1.00, this strapped prior art approach has an improvement of a factor of 4.42 over the standard PCell and was the best of all of the prior art approaches.

To operate safely with minimal current limiting mechanisms such as electromigration, a dimension limit is put on the conductive stripe or finger width, which is the wire used to connect the drain and source of a FET or to connect to the collector and emitter of a bipolar transistor. By using a larger gate pitch and wider metal lines, current densities are reduced. However, the disadvantage of this approach is that the metal width that is required can be very significant. For example, a gate finger width of 10 µm would require a (M2) (the second level of metal) width of about 5.8 µm, which requires an intolerable gate pitch to accommodate. Another approach is to strap higher levels of metal over the (M2) finger or stripe. However, the problem with this approach is that parasitic capacitance between adjacent fingers will be increased while the current capability only can be increased slightly. Also, using more metal levels may not be available or feasible in the layout. Another approach is a half-plane, which has no electromigration problems on (M2), but does on the half of the M1 that is not covered by (M2) and therefore still suffers a limit on the maximum width of (M1). Thus, the electromigration safety of the half-plane layout is limited.

Therefore, the layout approach needed in solving current limiting mechanisms including electromigration must 1) permit very long device fingers, 2) be electromigration safe for any number of levels of metals and for all available types of metals, and 3) must not increase gate pitch.

SUMMARY OF THE INVENTION

Therefore, it is an object of the present invention is to provide, for an integrated circuit chip, an interconnecting metalization layout and method of manufacturing the layout to minimize current limiting mechanisms including electromigration while containing very long metal fingers.

Another object of the present invention is to provide a safe layout for current limiting mechanisms including electromigration without any constraints on the number of levels and types of metal that can be used.

A further object of the present invention is to provide a safe layout for current limiting mechanisms including electromigration without increasing the gate pitch.

The foregoing and other objects are achieved by one aspect of the integrated circuit layout having a plurality of transistors having first, second and third elements to make contact. A contact is connected to the second element at a higher vertical level than normal and the width (corresponding to the channel width of an FET) of the metal finger being wider than normal and yet the layout is current limiting or electromigration safe. If the transistor is a field effect transistor (FET), the drain contact is disposed at a higher vertical level whereas, if the transistor is a bipolar, the collector contact is disposed at higher vertical level. With the FET, a double source contact herein is used and, with the bipolar, a double emitter herein is used. By balancing the possibility of current limiting mechanisms including electromigration between the first level of metal (M1) and (M2), this layout can be optimized. It also can be further improved by employing at least third and fourth levels of metal (M3 and M4).

Another aspect of the present invention is defined as an "overlap plane" layout in which the second level metal (M2) covers the end sections of the device or chip fingers while strapped (M2) fingers are disposed at the center of the device.

A further aspect of the present invention is a pyramid or stair case layout in which the dimensions of the M1-M4 metals are such that the current flows smoothly.

BRIEF DESCRIPTION OF THE DRAWINGS

The foregoing and other objects, aspects and advantages will be better understood from the following detailed description of a preferred embodiment of the invention with reference in the drawings, in which.

DETAILED DESCRIPTION OF THE PREFERRED EMBODIMENTS OF THE INVENTION

A conventional method of forming a conductive pattern for connecting devices of integrated circuit chip comprises depositing a conductive layers on the chip substrate separated by insulating layers (not shown). As shown in the half-plane cross-sectional layout of FIG. 3, a wafer 10 includes devices with, herein, sources 11 and gates 12. A number of vias 13 connect the sources and drains to the first level of source metal (M1) 14 and drain metal (M1) (not shown). Only half of this number of vias 15 connect source (M1) to the second level of metal (M2) 16, which spans half the width of metal (M1) 14. Thus, the name of this layout is "half-plane". The gate is via connected to its (M1) metal 17. In these FIGs and the remaining FIGS illustrating cross-sectional and plan views, the spaces between vias and metal lines is insulation, such as silicon oxide, which is not shown. The drain (M2) finger 18 is connected to (M1) (not shown) and to the drain (not shown). Wiring of this device or integrated circuit to other devices or integrated circuits fabricated on the same wafer may be accomplished using additional metal levels, such as (M3) and (M4).

Figure 4:
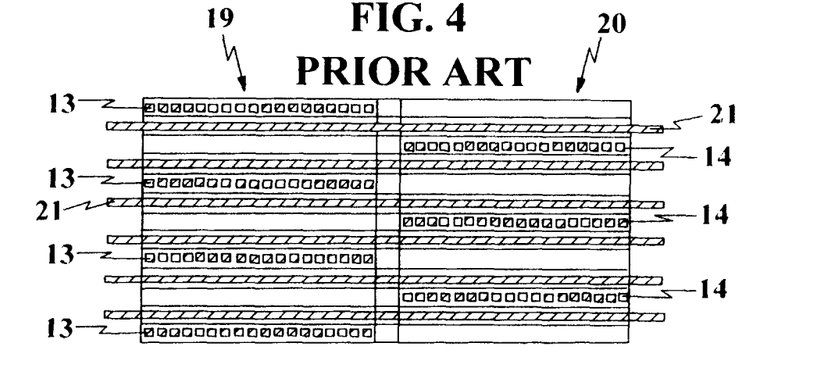
FIG. 4 PRIOR ART is a plan view illustrating the half-plane layout of the prior art.
Figure 5:
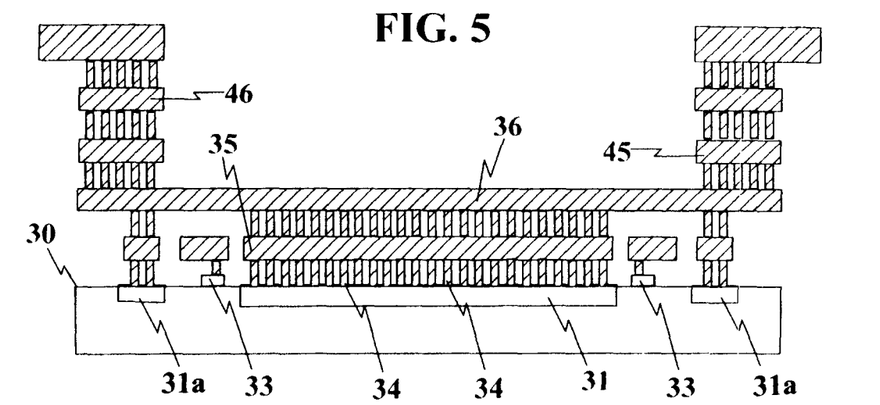
FIG. 5 is a cross-sectional view illustrating one aspect of the present invention with double sided contacts for the source and with the vertical drain in a plane above the device.

As further illustrated in FIG. 4 PRIOR ART, the source (M2) half-plane 19 is side by side with the drain half-plane 20 at (M2). Vias 13 are connected to source (M1) but only to half of (M1) source plane as established by the vias 13. The same is true of the drain plane (M2) 20 in that only half of the (M1) drain plane is connected to the (M1) drain plane as again established by the vias 14. Wide corresponding to channel length) FET sources and drains (or, equivalently, bipolar emitters and collectors) supply more current and thus require more metal to avoid the effects of electromigration. This sets a limit on the maximum width for the source and drain regions covered solely by (M1). The remaining half of each finger is strapped with a (M2) metal plane, which combines with (M1) to carry the remaining current. Even by maximizing the width of the (M1) fingers, the half-plane layout only provides an improvement in maximum unit finger width of about 2.5 times over the base RF PCell.

Figure 6:
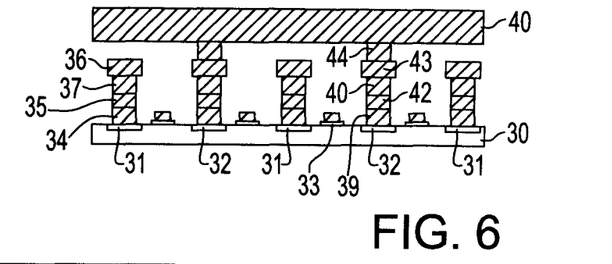
FIG. 6 is an enlarged cross-section view illustrating the vertical drain of the present invention extending up from the wafer to a plane above the device.

Now, in accordance of one aspect of the present invention as illustrated in FIGS. 5-8, the interconnection structure employs a double source contact to double the structure's finger width. Since the drain cannot be connected out at the end of the fingers due to the presence of the source connections, the drain connection is routed vertically above to a plane covering the device and, hence is termed a "vertical drain" layout. Since routing source and drain from the same side would create parasitics, only the source is routed at both ends. The drain is taken out vertically, as best illustrated by a combination of FIG. 6 and FIG. 7, in which a wafer 30 contains FETs with sources 31, substrate contacts 31a, drains 32, and gates 33. A via (V0) 34 connects the source 31 to first level source metal (M1) 35 which, in turn, connects the source to the second level source metal (M2) 36 through a via (V1) 37. The ends of source M1 35 and M2 36 extend to the opposite ends of the FET device in the wafer. The drain connections, as best illustrated in FIG. 6, comprise a drain via (V0) 39 in contact with the drain 32 in the wafer 30. These vias 39 connects the drain 32 to the drain's third level of metal (M3) 40, which is in a plane above the entire device through drain (M1) 41, drain via (V1) 42, drain (M2) 43 and drain via (V2) 44.

Figure 7:
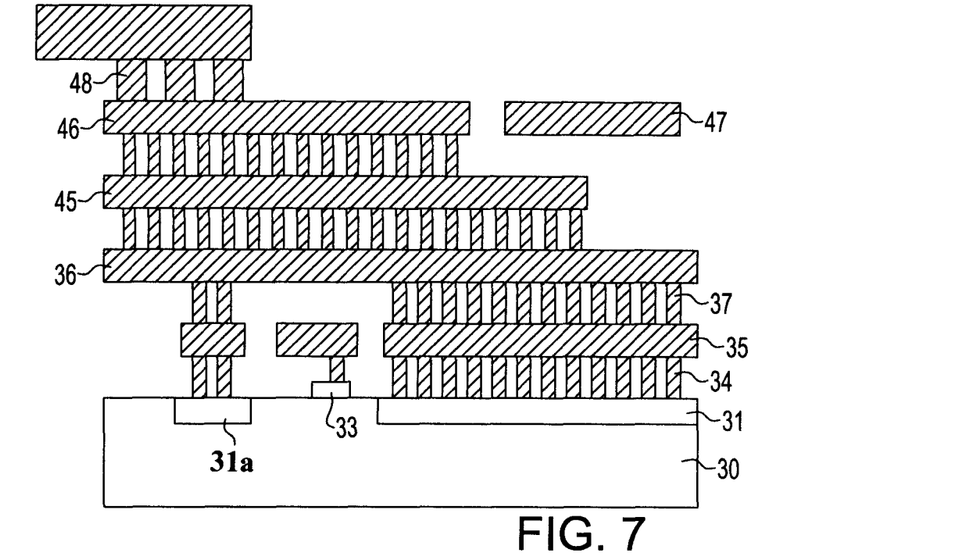
FIG. 7 is a cross-sectional view illustrating the vertical drain aspect of the present invention in which the source finger's metallization consists of multiple levels of metal, with each successive level staggered or offset to optimize current flow for the safest design against current limiting mechanisms including electromigration.

The vertical drain aspect of the present invention can be improved by (a) widening the metal wires; (b) using strapping (M3) 45 and (M4) 46 over the source at the edges of the device; and using drain (M4) 47 (FIG. 7) for the drain connection at other than the edges of the device. As shown in FIG. 7, source (M3) 45 reduces the peak current in source (M2) 36 as (M2) crosses the gate 33. Source (M4) 46 is added to further reduce the peak current density. The edges closest to the device for metal levels (M3) 45 and (M4) 46 are increasingly set back in order to form a staircase pattern, encouraging smooth current flow and uniform current density in the transition between metal levels.

Figure 8:
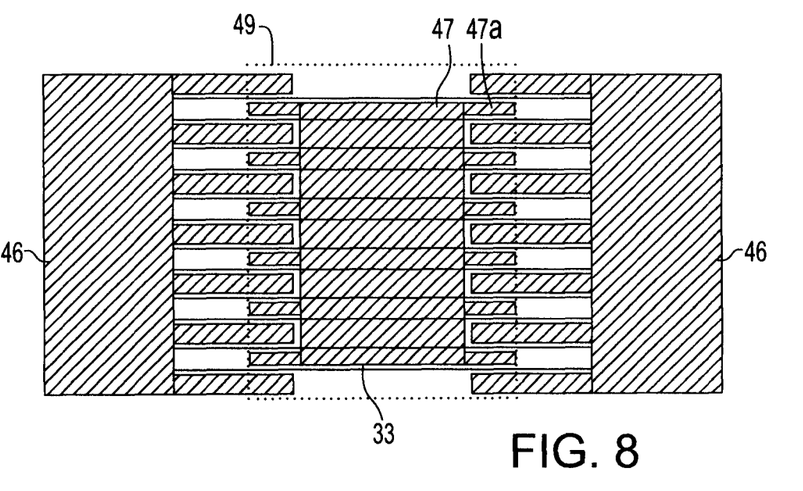
FIG. 8 is a plan view illustrating the vertical drain aspect of the present invention in which the elevated drain is covering the entire device except for the edges at which a comb-shaped metallization is disposed to allow the source metallization to strap the source lines.

FIG. 8 shows the plan view of the (M4) level of metallization. The drain level (M4) 47 of metallization covers the entire device area, as illustrated by a dashed line 49, except for the edges 47a, which are in the shape of a comb-like structure to allow the source (M4) 46 metallization to strap the source lines. The division between the elevated drain metal plane and the edge source metal comb is determined by optimizing for maximum electromigration resistance. The exact position of partition between the plane-like and comb-like shape for drain (M4) 47 is designed to maximize electromigration-safe current carrying capability in the source and drain wiring. An electromigration safe or limit on an interconnection layout is defined, for example, as approximately 5 mA per square micron of cross sectional area in copper at 100° C. The parallel lines across the drain (M4) metallization represent the gates 33 of the FETs. The vertical drain aspect of the present invention provides an improvement over the base PCell of almost 4.5 times for the standard width wires and over 9.5 times for the wide width wires.

Figure 3:
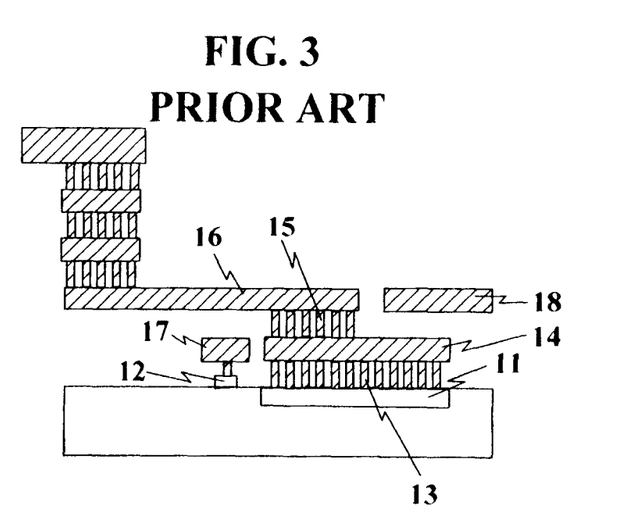
FIG. 3 PRIOR ART is a cross-sectional view illustrating the half-plane layout of the prior art.
Figure 9:
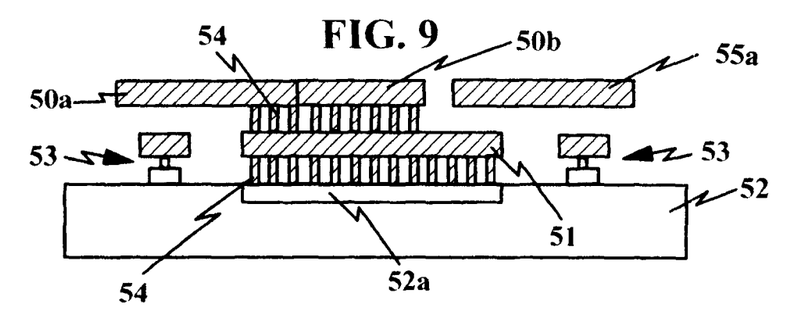
FIG. 9 is a cross-sectional view illustrating the overlap plane aspect of the present invention in which a wide (M2) plane are disposed at the edges of the device and source/drain (M2) fingers are disposed at the center, with the proportion of wide (M2) plane and (M2) fingers optimized for maximum safe current flow.

Another aspect of the present invention is referred to as an "overlap plane" and is illustrated starting at FIG. 9. In the prior art half-plane, as shown in FIG. 3 PRIOR ART, the electromigration problem is in the (M1) finger 14 that runs underneath the (M2) half-plane 16. The overlap plane of the present invention solves this problem by shifting the inner edge towards the outer edge of the overlapping plane 50a and adding a strapping finger 50b in the center of the (M1) finger. As shown in FIG. 9, strapping fingers 54 are added in the center of the (M1) finger 51. Also shown in FIG. 9 is the wafer 52 with a source 52a, gates 53, vias 54 and drain plane (M2) 55. If the finger 50b in the center is sufficiently long, then the electromigration problem is solved in the (M1) finger but electromigration becomes a problem for the (M2) finger. By balancing the size of the (M1) and (M2) fingers, this problem is minimized. This balance is achieved by setting the width of the (M1)-only region to the width at which the current collected from that finger width is equal to the maximum electromigration-safe current of (M1). The width of the region strapped by (M1) and (M2) is such that the current collected by the combined (M1)-only and (M1) plus (M2) strapped portions of the finger is equal to the maximum electromigration-safe current of a (M1) finger strapped by an (M2) finger. Finally, the width of the region beneath the solid (M2) plane is such that the current collected by the total finger width (from a channel dimension standpoint) is equal to the maximum electromigration-safe current of (M1) plus the (M2) plane.

Figure 10:
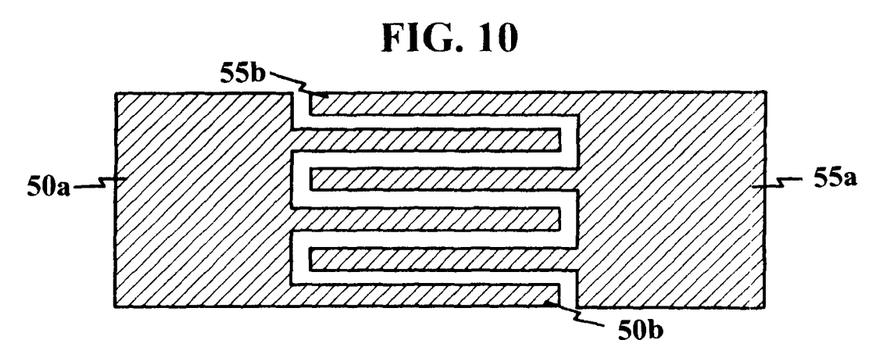
FIG. 10 is an enlarged plan view illustrating the overlap plane aspect of the present invention in which the (M2) device fingers are interleaved.

As shown in FIG. 10, the overlap plane approach of the present invention is formed with a wide (M2) source plane 56 and a wide (M2) drain plane 57 at the edges of the device with narrow source (M2) fingers 58 interleaved with narrow drain (M2) fingers 59 extending to the center of the device. A further improvement is made in the overlap plane layout of the present invention by strapping (M1) and (M2) fingers with metal and widening the metal lines.

Figure 11:
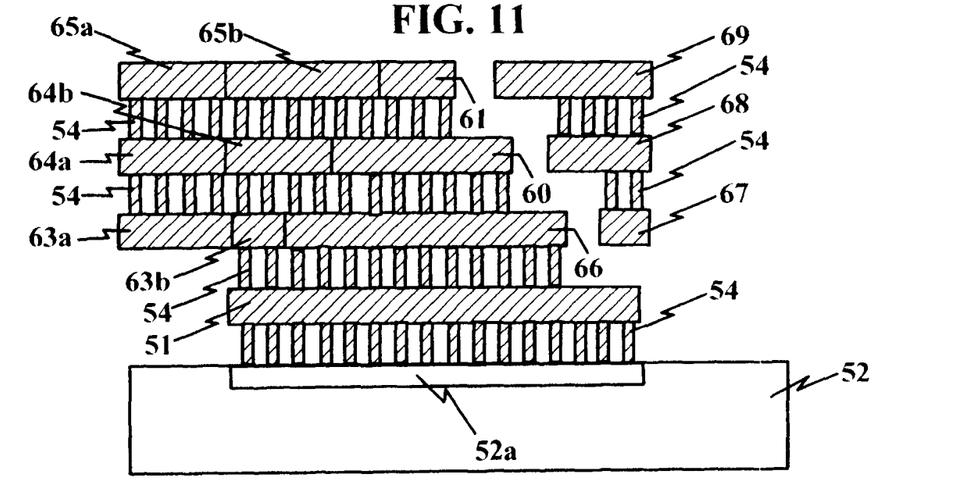
FIG. 11 is a cross-section view illustrating the overlap plane aspect of the present invention with a pyramid-type or stair case multi-level metallization.

FIG. 11 illustrates another aspect of the present invention, which can be employed to improve the overlap plane approach. This improvement is achieved by forming the overlap plane with (M3) fingers 60 and (M4) fingers 61 as illustrated in FIG. 11. This aspect of the present invention is referred to as a "pyramid" or stair step layout in that wide overlap planes (M2) 63a, (M3) 64a and (M4) 65a connect to the narrower fingers (M2) 63b and 66, (M3) 64b and 60, and (M4} 65b and 61. Also shown in FIG. 11 is the drain planes (M2) 67, (M3) 68 and (M4) 69 along with the wafer 52 with source 52a and vias 54. The gates are not shown. Because of the pyramid structure, the diagonal current flows from the wide overlap into the narrower fingers in the center of the device. This pyramid aspect of the present invention, when used with the layout of the overlap plane aspect of the present invention, resulted in the lowest peak current density and a reduction in capacitance.

The maximum finger widths that can be achieved by the aforementioned implementation may not be sufficient for some applications. Also, if better electromigration resistance is required, the finger width should be below the number for maintaining maximum current and less than the threshold for electromigration safe operation. As stated previously, an electromigration safe limit on an interconnection layout is, herein, approximately 5 mA per square micron of cross sectional area in copper at 100° C. The overlap plane aspect of the present invention as described above contains source and drain contacts above the device in the form of (M2) metal planes. As a result, a wider finger device can be formed by abutting several short blocks, each of which is electromigration safe. In this approach, the source and drain lines at the top layer of the layout form alternating regions or fingers of (M2) which are akin to the (M1) source and drain fingers but much wider and oriented at right angles. Such a structure may then be considered analogous to the original FET being wired, with the overlap plane approach applied recursively using the next higher levels of available interconnect metal. Since the pitch of the (M2) stripes being contacted is greater than that of the original source and drain pitch, wider vias and thus wider and thicker metal may be employed, such as double-thickness metal (M1 2B) and (M2 2B). These double thickness metals are labeled (M1) and (M2) but the (2B) indicates that (M1) is the first metal of double thickness and (M2) is the second metal of double thickness. They do not replace the (M1) and (M2) of single thickness but are additional metal planes or fingers.

Figure 12:
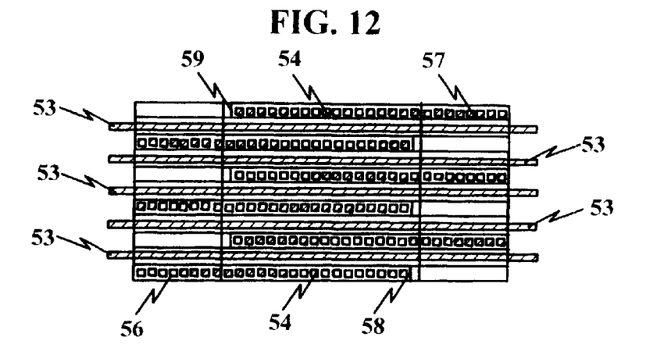
FIG. 12 is a plan view illustrating the overlap plane aspect of the present invention with reduction of the half-plane to permit a comb of strapped source/drain fingers in the center.
Figure 13:
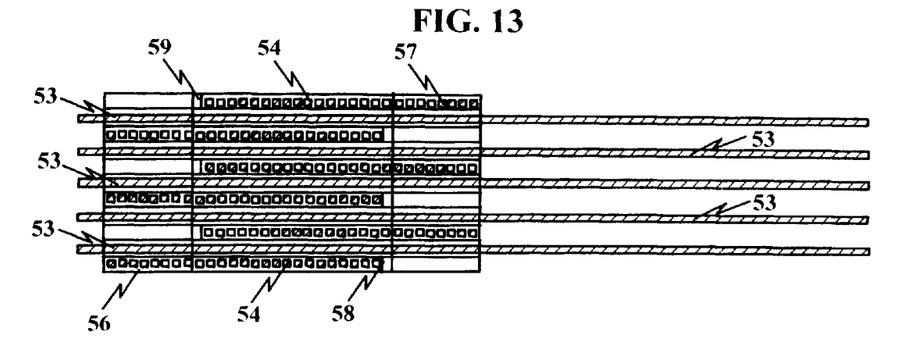
FIG. 13 is a plan view illustrating the overlap plane aspect of the present invention with a single source/drain metallization disposed over half of a very wide finger device and duplicated in mirror image and abutted fashion until the full finger width is covered.
Figure 14:
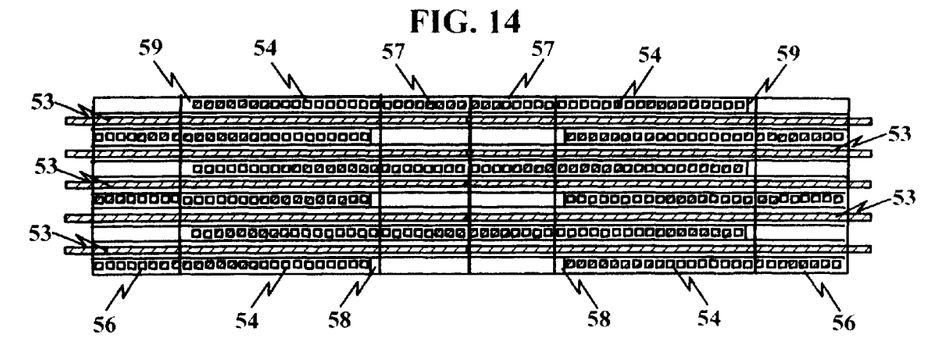
FIG. 14 is a plan view illustrating the overlap plane aspect of the present invention with the finger device of FIG. 12 covered by mirror image source/drain metallization.
Figure 15:
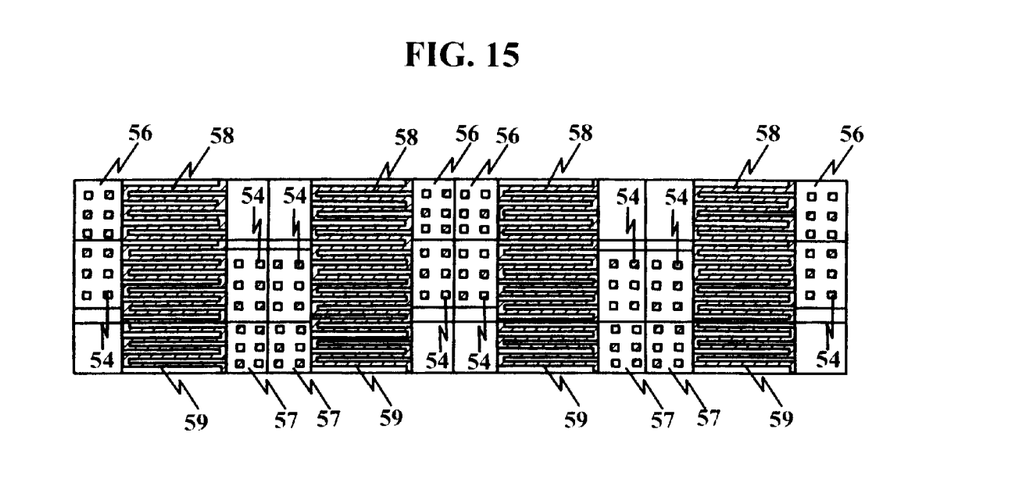
FIG. 15 is a plan view illustrating the overlap plane aspect of the present invention implemented in a recursive fashion.

In FIG. 12, a plan view shows the overlap plane layout with gates 53 and source plane (M2) 56 connecting (M1) source fingers (not shown) through vias 54, and drain plane (M2) 57 connecting (M1) drain fingers (not shown). The (M2) source fingers 58 and (M2) drain fingers 59 are strapped to (M1) (not shown) through vias 54 in the center of the block. Using this layout as a single source/drain metallization block with a very wide finger device, as illustrated in FIG. 13, the block can supply the source and drain current without any electromigration problems for the device area. As shown in FIG. 14, the remaining half of the device fingers are covered with another source/drain metallization block and, herein, is a mirror image. Each of the two blocks handles the source and drain current of the area that it covers. As a further optimization of the overlap plane aspect of the present invention, recursive application of the overlap plane layout permits using the (M1 2B) and (M2 2B) metallizations and helps maximize the number of fingers that can be placed in parallel. Metal (M2) in the device of FIG. 14 is now treated as analogous to the source and drain of an FET or the emitter and collector of a bipolar transistor and the scheme of FIG. 14 repeated, with (M1 2B) and (M2 2B) substituted for references to (M1) and (M2). Since the pitch of (M1 2B) and (M2 2B) is now larger than the original pitch of (M1) and (M2), these metal levels may be thicker (e.g. double thickness) and thus contribute further toward high current capability.

Table II below compares the different layouts of the present invention with the PCell with a base improvement of 1.00. All of the layout aspects of the present invention, which are "overlap plane" "pyramid" and "vertical drain", range from over 3 times to over 9.5 times improvement in comparison to the PCell.

TABLE II

| Layout | Wide Metal | Metal Levels | Cds* | Max Unit Finger | Improvement over PCell |
|---|---|---|---|---|---|
| RF PCell | No | 2 | 348 | 0.76 | 1.00 |
| Overlap Plane | No | | 375 | 2.52 | 3.32 |
| Overlap Plane, strap | Yes | 2 | 595 | 3.64 | 4.79 |
| Overlap Plane, strap | Yes | 2 | 612 | 3.92 | 5.16 |
| M2/M3 | Yes | 3 | 830 | 4.48 | 5.89 |
| Overlap Plane, strap M1/M2 and M3/M4 | Yes | 3 | 545 | 3.92 | 5.16 |
| Pyramid, M1-M3 | | | | | |
| Pyramid, M1-M4 | Yes | 4 | 659 | 4.76 | 6.26 |
| Vertical Drain | No | 4 | 574 | 3.36 | 4.42 |
| Vertical Drain, wide metallines* | Yes | 4 | 720 | 7.28 | 9.58 |

*Wide metal lines refers to using maximum width lines that satisfy the ground rules without changing gate pitch. Normal wires are 0.14 um whereas wide wires are 0.28 um.

Figure 16:
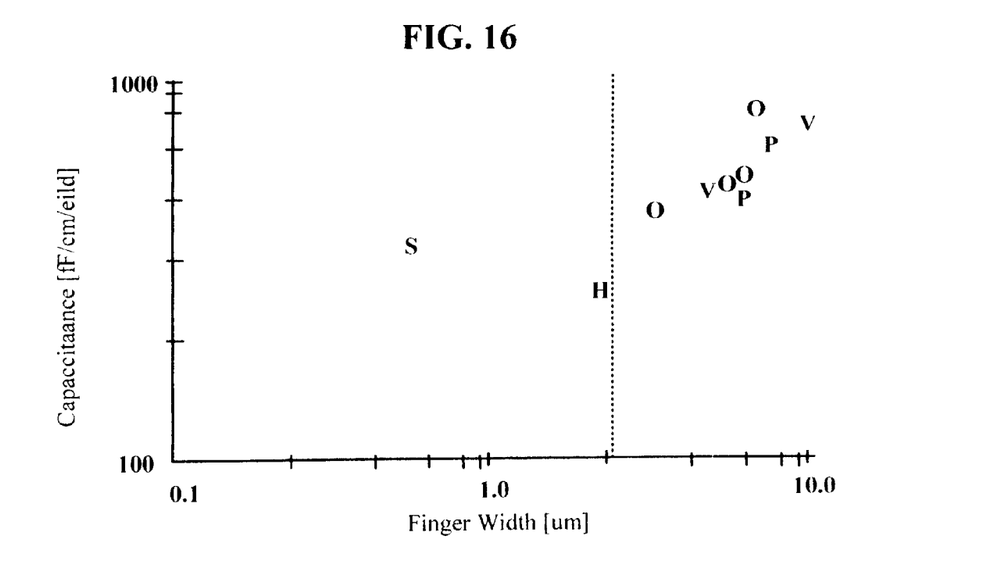
FIG. 16 is a log-scale graph plotting the maximum finger width versus the backend drain-to-source capacitance.

Finally, FIG. 16 is a log-scale graph plotting finger width (um) versus backend source to drain capacitance of some of the prior art layouts and the layout aspects of the present invention. A dashed line separates the two and illustrates the wide finger width (corresponding to channel width) capability of all of the inventive layouts in contrast to the prior art layouts. The layout points on the graph are identified by the first letter of the name of the layout. They are as follows:

| | |
|---|---|
| Standard PCell | S |
| Metal1 (M1) Only | M |
| Half-Plane | H |
| Overlap-Plane | O |
| Pyramid Overlap | P |
| Vertical Drain | V |

Although this invention has been described relative to specific embodiments for purposes of understanding, it will be realized that alterations and modifications may be made thereto without departing from the scope of the following claims. Therefore, the present embodiments, such as to FET transistors, are to be considered as illustrative and not restricted, and the invention is not be limited to the details given herein, but may be modified within the scope and equivalents of the following claims.

What is claimed is:

1. An integrated circuit chip comprising:
   a plurality of transistors each having first, second and third elements for making contact; and
   interconnecting metal wires including via metal of a plurality of levels and width dimension for connecting said first, second and third elements of said transistors to said metal wires at different levels and labeled metal one (M1), metal two (M2) to provide connections to the transistors, said interconnecting wires including metal fingers and metal planes disposed in the center and at the edges of the chip,
   wherein said first element is formed with a double source contact having a first portion coupled to a first substrate contact through a first metal layer and a second metal layer and a second portion coupled to a second substrate contact through the first metal layer and the second metal layer.

2. The integrated circuit chip of claim 1, wherein the interconnecting wires for said second elements of the transistors are at a vertically higher level than said interconnecting wires of said first elements of the transistors.

3. The integrated circuit chip of claim 1, wherein the first elements of the transistors are the sources of FET transistors.

4. The integrated circuit chip of claim 1, wherein the second elements of the transistors are the drain of FET transistors.

5. The integrated circuit of claim 1, wherein the second metal layer forms a contiguous structure enclosing one of the plurality of transistors.

6. The integrated circuit of claim 1, wherein the ends of the first metal layer and the second metal layer extend to the opposite ends of a transistor.

7. The integrated circuit of claim 1, wherein the second metal layer forms a contiguous structure enclosing the plurality of transistors.

8. The integrated circuit chip of claim 1, wherein said first element is included with a double source contact.

9. The integrated circuit chip of claim 1, wherein electromigration is balanced between the metal one (M1) level and the metal two (M2) level.

10. The integrated circuit chip of claim 1, wherein a third level (M3) and a fourth level (M4) are added to the interconnecting metallization.

11. The integrated circuit chip of claim 10, wherein said metal lines are wide and the interconnecting metallization is electromigration safe at a maximum unit finger width of about 7.28 mu.

\* \* \* \* \*